US 8,609,467 B2

(12) United States Patent
Fukushima et al.

(10) Patent No.: US 8,609,467 B2
(45) Date of Patent: Dec. 17, 2013

(54) LEAD FRAME AND METHOD FOR MANUFACTURING CIRCUIT DEVICE USING THE SAME

(75) Inventors: Tetsuya Fukushima, Fukaya (JP); Takashi Kitazawa, Kumagaya (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 356 days.

(21) Appl. No.: 12/415,423

(22) Filed: Mar. 31, 2009

(65) Prior Publication Data

US 2010/0244210 A1  Sep. 30, 2010

(51) Int. Cl.
*H01L 21/00* (2006.01)
(52) U.S. Cl.
USPC .............................. 438/123; 438/33; 438/68
(58) Field of Classification Search
USPC .............................. 438/33, 68, 123
See application file for complete search history.

(56) References Cited

U.S. PATENT DOCUMENTS

| | | | |
|---|---|---|---|
| 6,400,004 B1 * | 6/2002 | Fan et al. | 257/666 |
| 6,563,199 B2 * | 5/2003 | Yasunaga et al. | 257/666 |
| 6,608,366 B1 * | 8/2003 | Fogelson et al. | 257/666 |
| 6,700,186 B2 * | 3/2004 | Yasunaga et al. | 257/672 |
| 6,744,118 B2 * | 6/2004 | Ikenaga et al. | 257/666 |
| 6,825,062 B2 * | 11/2004 | Yee et al. | 438/106 |
| 6,835,600 B2 | 12/2004 | Utsumi et al. | |
| 6,847,099 B1 * | 1/2005 | Bancod et al. | 257/666 |
| 6,872,599 B1 * | 3/2005 | Li et al. | 438/123 |
| 7,008,825 B1 * | 3/2006 | Bancod et al. | 438/123 |
| 7,943,431 B2 * | 5/2011 | San Antonio et al. | 438/123 |
| 2002/0079561 A1 * | 6/2002 | Yasunaga et al. | 257/670 |
| 2003/0141577 A1 * | 7/2003 | Hung et al. | 257/676 |
| 2003/0203541 A1 * | 10/2003 | Utsumi et al. | 438/112 |
| 2003/0205792 A1 * | 11/2003 | Chen et al. | 257/676 |
| 2005/0116321 A1 * | 6/2005 | Li et al. | 257/666 |
| 2006/0208344 A1 * | 9/2006 | Shiu et al. | 257/666 |
| 2007/0126092 A1 * | 6/2007 | San Antonio et al. | 257/674 |
| 2008/0251902 A1 * | 10/2008 | Masuda et al. | 257/676 |
| 2009/0108419 A1 * | 4/2009 | Kuo et al. | 257/666 |
| 2009/0206459 A1 * | 8/2009 | Wu | 257/676 |
| 2009/0289342 A1 * | 11/2009 | Kasuya et al. | 257/690 |

FOREIGN PATENT DOCUMENTS

| | | |
|---|---|---|
| JP | 2002-246530 | 8/2002 |
| JP | 2004-172542 | 6/2004 |

OTHER PUBLICATIONS

Korean Office Action mailed Sep. 20, 2010 directed to corresponding application No. 2010-041741105; 4 pages.

* cited by examiner

*Primary Examiner* — James Mitchell
(74) *Attorney, Agent, or Firm* — Morrison & Foerster LLP (57) ABSTRACT

Provided are: a lead frame enabling efficient manufacturing of multiple circuit devices; and a method for manufacturing a circuit device using the same. In the lead frame of the present invention, units are arranged and frame-shaped first and second supporters are provided around the units to mechanically support the units. Moreover, a half groove is provided in the first supporter at a portion on an extended line of a dividing line defined at a boundary between each adjacent two of the units. Furthermore, a penetration groove penetrating a part of the second supporter at a portion on an extended line of another dividing line is provided.

4 Claims, 10 Drawing Sheets

LEAD FRAME AND METHOD FOR MANUFACTURING CIRCUIT DEVICE USING THE SAME

BACKGROUND OF THE INVENTION

1. Field of the Invention

The present invention relates to: a lead frame that is usable as a single base allowing efficient manufacturing of multiple circuit devices; and a method for manufacturing a circuit device using the same.

2. Description of the Related Art

The capacitance of semiconductor devices is increasing year after year, which in turn increases the number of lead terminals to work as various signal lines. Along with this trend, a semiconductor device with a quad flat package (QFP) with lead terminals extending in four directions and a semiconductor device with a quad flat non-leaded (QFN) package have been used. Meanwhile, small, thin and light semiconductor devices are demanded for use in cellular phones, portable computers, and the like. For this reason, there is a demand for downsizing of the mounting area for a semiconductor device, and a chip size package (CSP) is utilized to meet this demand. The CSP is a type of package mountable in an area equal to or slightly larger than its chip size by having leads exposed from the back surface of a resin sealed body.

As a conventional semiconductor-device manufacturing method in which a resin is molded in a resin-sealing die with a sealing sheet, there is a known technology in which: the sealing sheet is pasted on a lead frame at an entire surface opposed to the surface to which a semiconductor element is fixed; the lead frame pasted with the sealing sheet is placed in the resin-sealing die; and the resin is molded. This technology is described for instance in Japanese Patent Application Publication No. 2004-172542.

Figure 9:
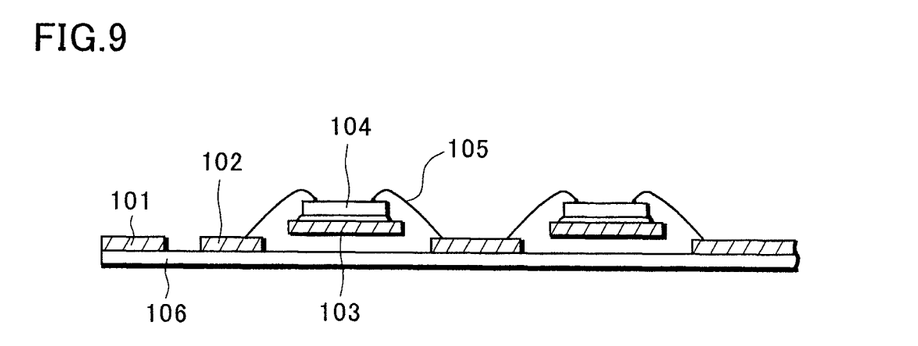
FIG. 9 is a cross-sectional view for illustrating a method for manufacturing a circuit device in a conventional art.
Figure 10:
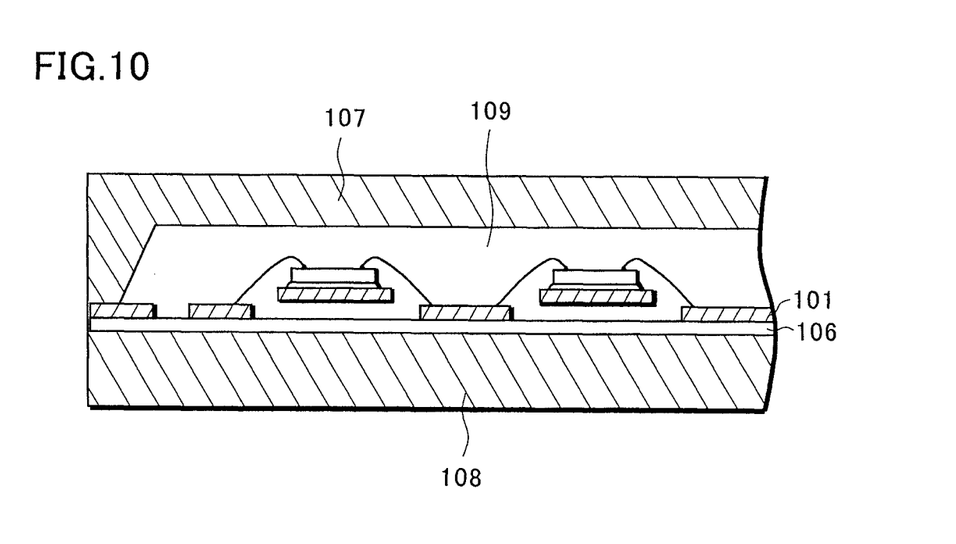
FIG. 10 is a cross-sectional view for illustrating the method for manufacturing a circuit device in the conventional art.
Figure 11:
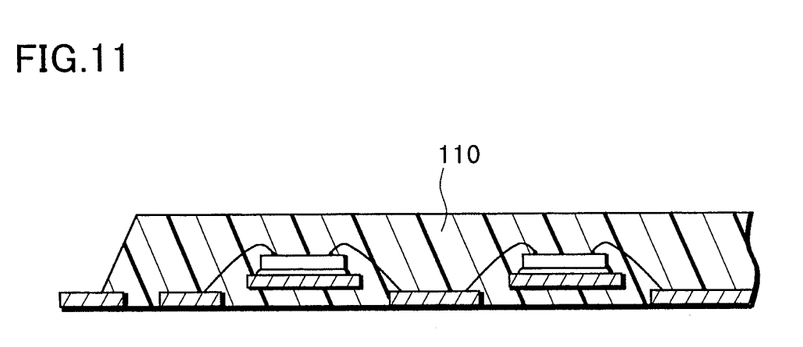
FIG. 11 is a cross-sectional view for illustrating the method for manufacturing a circuit device in the conventional art.

Hereinafter, description will be given briefly of the conventional semiconductor-device manufacturing method in which a resin is molded in a resin-sealing die with a sealing sheet with reference to FIGS. 9 to 11. FIG. 9 is a cross-sectional view for describing a lead frame pasted with a sealing sheet. FIG. 10 is a cross-sectional view for describing a state where the lead frame is placed in a resin-sealing die. FIG. 11 is a cross-sectional view for describing a state after a resin package is formed.

Firstly, as shown in FIG. 9, multiple mount portions are formed inside a lead frame 101, each mount portion including at least a signal-connecting terminal 102 and a die pad 103 on which a semiconductor chip 104 is mounted. After a sealing sheet 106 is pasted on the back surface of the lead frame 101, the semiconductor chip 104 is bonded to the upper surface of the die pad 103 with an adhesive. Then, the semiconductor chip 104 bonded to the die pad 103 is electrically connected to the signal-connecting terminal 102 through a thin metal wire 105.

Subsequently, as shown in FIG. 10, the lead frame 101 which is pasted with the sealing sheet 106 and which is connected to the semiconductor chip 104 is placed in a cavity 109 of a resin-sealing die including an upper die 107 and a lower die 108. At this point, end portions of the lead frame 101 and of the sealing sheet 106 are held between the upper die 107 and the lower die 108, thereby forming the cavity 109. Then, although unillustrated, a sealing resin is injected into the resin-sealing die through a resin injection gate provided therein, and the resin is molded.

Thereafter, as shown in FIG. 11, the resin-sealing die is filled with the sealing resin, and a resin package 110 is formed. After that, the lead frame 101 in which the common resin package 110 is formed is taken out from the resin-sealing die. Then, although unillustrated, the common resin package 110 is cut off by dicing into the individual mount portions, and thus semiconductor devices are completed.

However, the above semiconductor-device manufacturing method needs a step of mechanically peeling off the resin package from the lead frame prior to dicing the resin package 110. Furthermore, when the multiple resin packages 110 are formed on the single lead frame, the method needs a step of pasting the multiple resin packages 110 individually on a dicing sheet after the multiple resin packages 110 are separated from the lead frame. Performing such steps complicates the manufacturing process and increases the manufacturing cost.

SUMMARY OF THE INVENTION

The present invention has been made in view of the above-described problems. A main object of the present invention is to provide: a lead frame enabling efficient manufacturing of multiple circuit devices; and a method for manufacturing a circuit device using the same.

A lead frame according to the present invention is a lead frame having units arranged therein, the units each including an island and a plurality of leads provided close to the island are arranged. The lead frame includes a frame-shaped supporter provided around the units to mechanically support the units, in which any one of a penetration groove and a half groove is provided in the supporter at a position on an extended line of a dividing line defined at a boundary between each adjacent two of the units, the penetration groove penetrating a part of the supporting portion, the half groove formed by making the supporting portion partially thin.

A method for manufacturing a circuit device according to the present invention includes the steps of: preparing a lead frame which has units arranged therein, the units each including an island and a plurality of leads provided close to the island are arranged, which includes a frame-shaped supporter provided around the units and used to mechanically support the units, and in which any one of a penetration groove and a half groove is provided in the supporter at a portion on an extended line of a dividing line defined at a boundary between each adjacent two of the units, the penetration groove penetrating a part of the supporter, the half groove formed by making the supporter partially thin; fixing a circuit element to the island of each of the units, and electrically connecting the circuit element to the leads; forming a sealing resin to cover the circuit element as well as the island and the leads constituting each of the units; and separating the sealing resin at the boundary between the two adjacent units, and separating the supporter of the lead frame at the portion where any one of the penetration groove and the half groove is provided.

BRIEF DESCRIPTION OF THE DRAWINGS

FIG. 1A is a plan view.

FIG. 3A is a plan view.

FIG. 4A is a cross-sectional view.

FIG. 7A is a plan view.

FIGS. 8A and 8B are plan views.

DESCRIPTION OF THE INVENTIONS

Hereinafter, description will be given of a lead frame and a method for manufacturing a circuit device using the same according to preferred embodiments of the present invention with reference to the drawings.

Figure 1A:
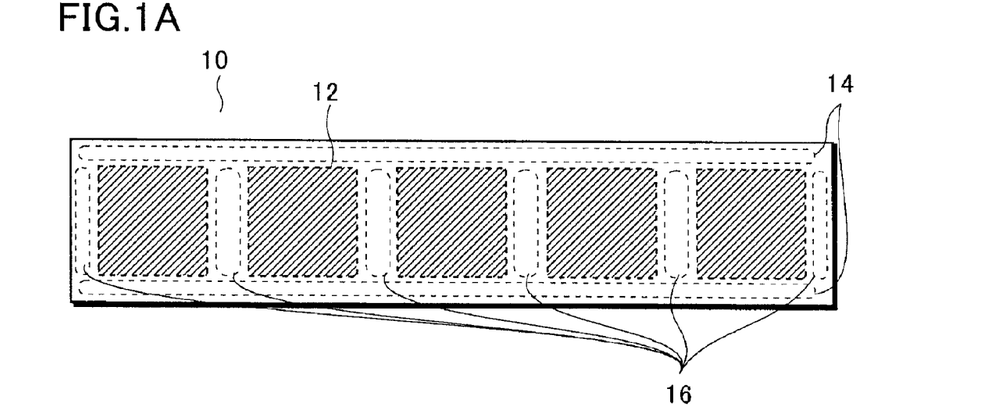
Figure 1B:
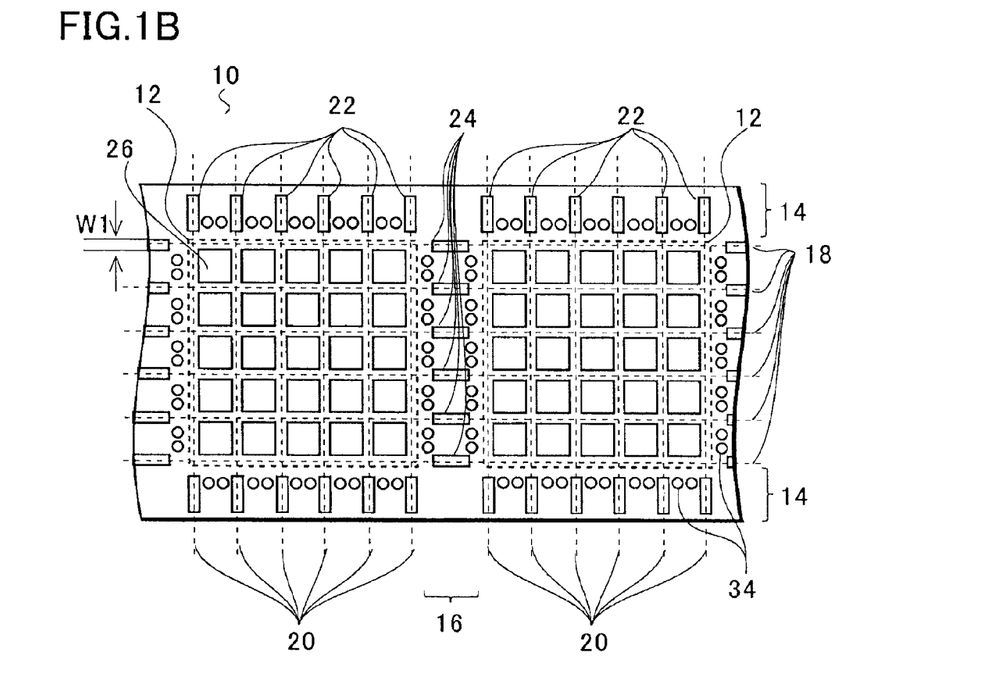
FIG. 1B is an enlarged plan view, showing a lead frame according to a preferred embodiment of the present invention.
Figure 2:
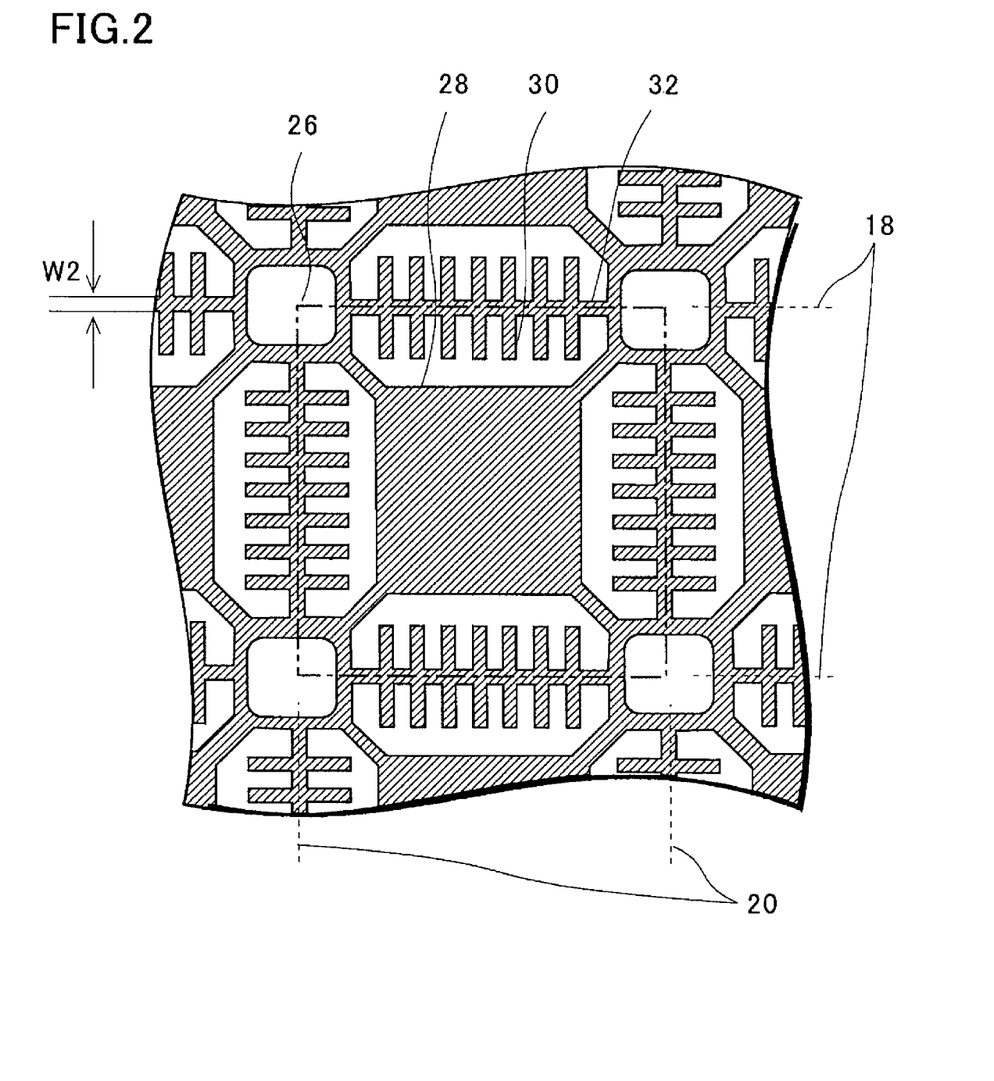
FIG. 2 is a plan view showing the lead frame according to the preferred embodiment.

First of all, the configuration of a lead frame 10 will be described with reference to FIGS. 1A to 2. Here, FIG. 1A is a plan view showing the entire lead frame 10. FIG. 1B is an enlarged plan view of blocks 12 arranged in the lead frame 10. FIG. 2 is a plan view showing the configuration of a unit included in the block 12.

As shown in FIG. 1A, the lead frame 10 is formed to have a predetermined shape by etching or punching conductive foil made of a metal such as copper having a thickness of approximately 0.2 mm, for example. The lead frame 10 has a strip-like shape with a planar size of length×breadth=60 mm×140 mm approximately. Furthermore, the top surface of the lead frame 10 is covered with a plating film formed by sequentially stacking, for example, nickel, palladium and gold in this order.

In the lead frame 10, a number of the blocks 12 are arranged apart from each other. Each block 12 is constituted of multiple units. Here, the five blocks 12 are arranged in line extending in a longitudinal direction of the lead frame 10. However, the number of the blocks 12 to be arranged may be one or two; alternatively, the number may be plural such as six or more.

First supporters 14 and second supporters 16 are provided in peripheral portions of the blocks 12; i.e., remaining regions where no block 12 is being formed. These supporters form an outer frame supporting the entire lead frame 10. The first supporters 14 are positioned in the peripheral portions extending in the longitudinal direction of the lead frame 10 and opposing to each other. The second supporters 16 are positioned in the peripheral portions extending in a short side direction of the lead frame 10 and opposing to each other. Furthermore, second supporters 16 are provided each between the two adjacent blocks 12.

The configuration of the block 12 provided in the lead frame 10 will be described in detail with reference to FIG. 1B. Inside the block 12, multiple units 26 are arranged in a matrix pattern. Herein, the unit 26 is a unit element for constituting a single circuit device. As shown in this drawing, five units 26 are provided in one row and five units 26 are provided in one column; thus, a total of 5 rows×5 lines=25 units are provided in the single block 12. However, a larger number of the units 26 can be provided in the block 12.

In this drawing, dashed lines each show a dividing line defined between the two adjacent units 26 provided in the block 12. Here, since the units 26 are arranged in the matrix pattern, the dividing lines are defined in a lattice pattern. Dividing lines 20 are defined in a vertical direction of the drawing, while dividing lines 18 are defined in a lateral direction of the drawing.

The dividing lines 20 are defined, extending from the lower end of the lead frame 10 to the upper end thereof. This indicates that the lead frame 10 is cut off from the upper end to the lower end thereof along the dividing lines 20 in the manufacturing process of a circuit device.

The dividing lines 18 are continuously defined from the left end of the lead frame 10 to the right end thereof. This also indicates that the lead frame 10 is cut off from the left end to the right end thereof along the dividing lines 18 in the manufacturing process of a circuit device. Furthermore, the identical dividing lines 18 are defined on all the blocks 12 provided in the lead frame 10. In other words, when dicing is performed along the dividing lines 18 in the manufacturing process, the units 26 included in the plural blocks 12 can be separated at once.

In the preferred embodiment of the present invention, in order to facilitate the cutting-off of the lead frame 10 at positions corresponding to the aforementioned dividing lines 18 and 20, half grooves 22 and penetration grooves 24 are provided at equal intervals.

The half grooves 22 are formed by partially making each of the first supporters 14 thin at portions corresponding to the dividing lines 20. The half grooves 22 are formed thin by half-etching the first supporter 14 by, for example, approximately 0.1 mm. By forming the half grooves 22 at the positions where the dividing lines 20 are defined as described above, the first supporter 14 can be divided easily at these portions. Thus, the degree by which a dicing saw used in dicing wears is reduced. Furthermore, since the half grooves 22 do not penetrate the lead frame 10, the half grooves 22 thus provided reduce less the mechanical strength of the first supporter 14.

The penetration grooves 24 are portions formed by penetrating a part of the second supporter 16 in portions where the dividing lines 18 are defined. At the portions where the penetration grooves 24 are formed, no metal material constituting the lead frame 10 exists, and thus the units 26 are easily separated by dicing along the dividing lines 18. Furthermore, the degree by which the dicing saw used in dicing wears due to this dicing is also reduced.

In this embodiment, the penetration grooves 24 penetrating the lead frame 10 are provided in the second supporter 16 extending in the short side direction, while the half grooves 22 not penetrating the lead frame 10 but formed by making the lead frame 10 partially thin are provided in the first supporter 14 extending in the longitudinal direction. By providing the half grooves 22 in the first supporter 14 extending in the longitudinal direction, the mechanical strength of the first supporter 14 is maintained at a predetermined value or more. Accordingly, flexure or bending of the lead frame 10 is reduced in the middle of the manufacturing process. As to the second supporter 16 extending in the short side direction, the required mechanical strength is weak compared with that of the first supporter 14. This weak mechanical strength enables the formation of the penetration grooves 24 penetrating the lead frame 10 in order to facilitate the dicing.

Here, the half groove 22 and the penetration groove 24 each have a width W1 of, for example, approximately 0.5 mm to 1.0 mm.

Additionally, the half grooves 22 may be provided in both a portion of the first supporter 14 through which the dividing line 20 passes and a portion of the second supporter 16 through which the dividing line 18 passes. Furthermore, the penetration grooves 24 may be provided in both these portions.

Furthermore, in each of the first supporters 14 which are partitioned by the dividing lines 20, round penetration holes 34 penetrating the first supporter 14 are formed. Similarly, penetration holes 34 are formed in the second supporters 16. The penetration holes 34 are to improve the adhesion between the lead frame 10 and a sealing resin applied in the manufacturing process.

The configuration of a unit included in the above-described block 12 will be described now with reference to FIG. 2. As described above, a unit 26 is a unit element for constituting a single circuit device. Here, the unit 26 is formed of: a single island 28; and multiple leads 30 arranged so as to surround the island 28 from the four sides.

Tie bars 32 are formed in a lattice pattern and each formed between the two adjacent units 26. A series of the leads 30 of each unit 26 extend inwardly of the unit 26 from the tie bars 32. Furthermore, the island 28 is connected to the tie bars 32 through hanging leads.

Moreover, the position of each tie bar 32 accurately corresponds to the dividing line 18 or 20 described with reference to FIG. 1B. Accordingly, when dicing is performed along the dividing lines 18, 20 in the manufacturing process, the tie bars 32 are removed.

Furthermore, the tie bars 32 are formed to be narrow to surely perform the aforementioned removal. The tie bar 32 has a width W2 of, for example, approximately 0.2 mm. Specifically, the tie bar 32 is formed so that the width W2 thereof can be narrower than the widths of the penetration groove 24 and the half groove 22 described with reference to FIG. 1B. Furthermore, the tie bar 32 is formed so that the width W2 thereof is narrower than the width of a dicing blade used in the manufacturing process.

Next, description will be given of a method for manufacturing a circuit device using a lead frame 10 with the above-described configuration with reference to FIGS. 3A to 7B.

Figure 3A:
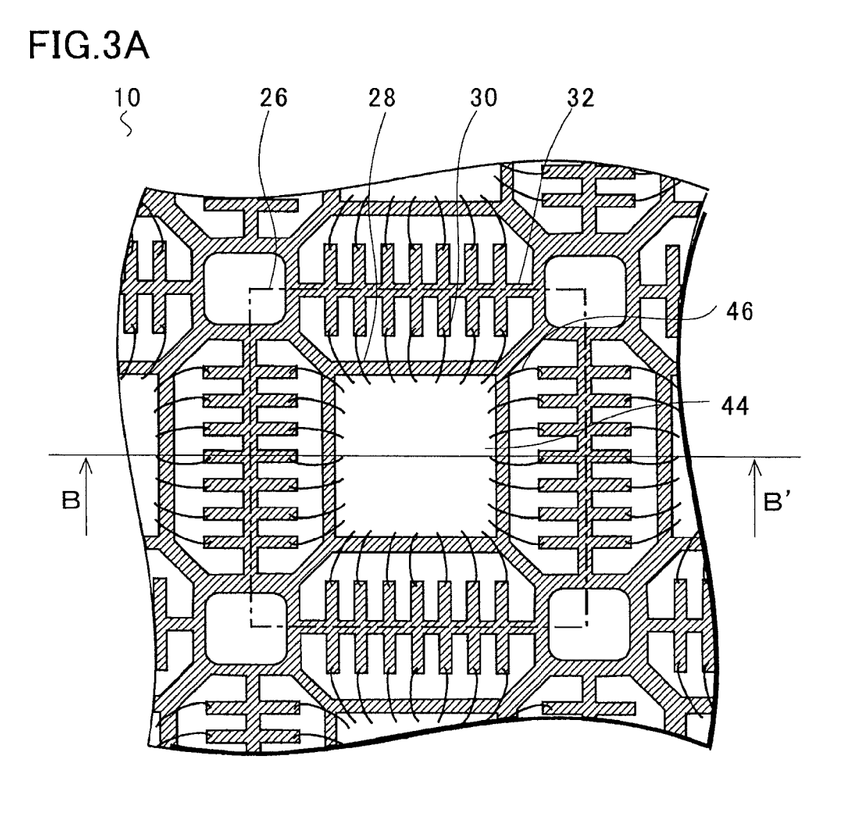
Figure 3B:
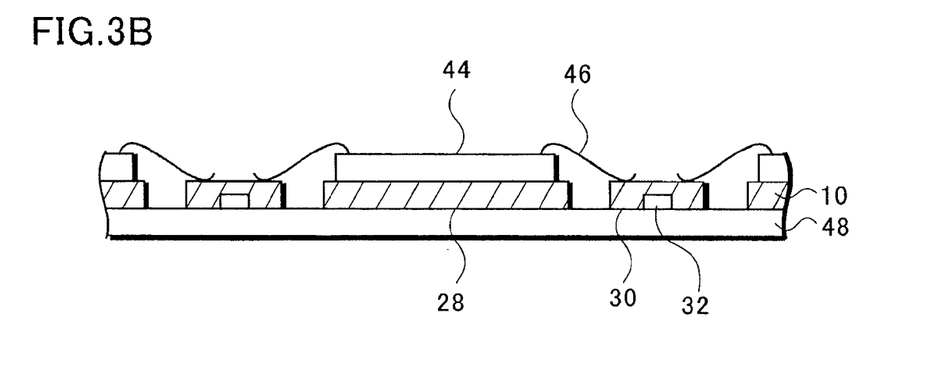
FIG. 3B is a cross-sectional view, for illustrating a method for manufacturing a circuit device according to a preferred embodiment of the present invention.

At first, a semiconductor element 44 is fixed to a predetermined position of the lead frame 10 as shown in FIGS. 3A and 3B. FIG. 3A is a plan view showing a single unit 26. FIG. 3B is a cross-sectional view taken along the line B-B' in FIG. 3A.

In this step, the lead frame 10 with the configuration shown in FIGS. 1A and 1B is prepared by a punching or etching process. Then, the semiconductor element 44 is die-bonded and wire-bonded to each block 12 (see FIGS. 1A and 1B) in the lead frame 10. In this step, the die-bonding and the wire-bonding are performed, at once, on all the blocks arranged in the lead frame 10 shown in FIGS. 1A and 1B.

As shown in FIG. 3A, firstly, the semiconductor element 44 is mounted on the upper surface of an island 28 with a conductive adhesive member such as solder or an insulating adhesive member such as an epoxy resin interposed therebetween. Subsequently, leads 30 are connected to electrodes provided on the upper surface of the semiconductor element 44 through thin metal wires 46.

In this step, the lower surface of the lead frame 10 is pasted on almost the entire upper surface of an adhesive sheet 48 as shown in FIG. 3B. The adhesive sheet 48 is a resin sheet, and an adhesive resin is applied on the upper surface of the sheet thinly. As the material of the adhesive sheet 48, for example, polyimide or polyethylene terephthalate (PET) is employed. The reason why the back surface of the lead frame 10 is pasted on the adhesive sheet 48 is to prevent a sealing resin from flowing around to the back surface of the lead frame 10 in the subsequent resin-sealing step.

Subsequently, as shown in FIGS. 4A to 5B, a sealing resin 36 is formed to cover the island 28, the lead 30, the thin metal wire 46 and the semiconductor element 44 shown in FIGS. 3A and 3B.

Figure 4A:
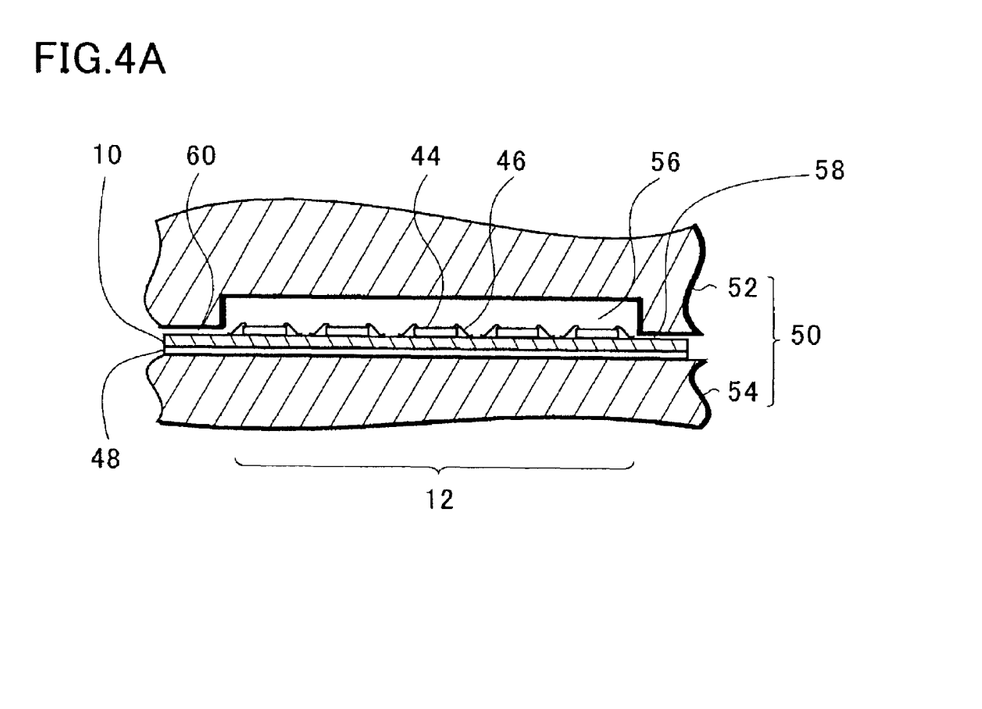

In this step, the resin sealing is performed using a mold die 50 including an upper die 52 and a lower die 54 as shown in FIG. 4A. In this step, transfer molding with a thermosetting resin such as an epoxy resin or injection molding with a thermoplastic resin such as polyethylene is employed.

In this step, the lead frame 10 pasted with the adhesive sheet 48 on the lower surface is disposed on the flat upper surface of the lower die 54, and abuts against the upper die 52 and the lower die 54. Thereby, each block 12 is accommodated in a single cavity 56 to perform the resin sealing.

The die 50 includes the upper die 52 and the lower die 54. The die 50 is provided with a gate 60 in a region corresponding to a peripheral portion of the block 12 and with an air vent 58 in a peripheral portion of the block 12 at the other side. The air vent 58 and the gate 60 oppose to each other. A liquid or semisolid sealing resin is injected into the cavity 56 through the gate 60. Then, air in the cavity 56 is released to the outside through the air vent 58. The amount of the released air corresponds to the injected amount of the sealing resin through the gate 60.

Moreover, in this step, the remaining portions (first supporters 14 and second supporters 16 shown in FIG. 1A) of the lead frame 10 around the blocks 12 are pressed by the upper die 52 and the lower die 54. Furthermore, in this step, the lower surface of the lead frame 10 is pasted on the adhesive sheet 48. Thus, even when the sealing resin is injected into the cavity 56 by a high pressure, the injected sealing resin is inhibited from flowing around to the lower surface of the lead frame 10. Note that, as shown in FIG. 3B, the lower surface of the lead frame 10 includes the lower surfaces of the island 28 and the leads 30 which are exposed to the outside as connection terminals. Accordingly, if the lower surface, of the lead frame 10 is covered with the sealing resin, the sealing resin makes it difficult to connect the island 28 and the leads 30 to an external component. For this reason, the above-described adhesive sheet 48 is employed in this embodiment to prevent the sealing resin from flowing around to the lower surface of the lead frame 10. Thus, the lower surfaces of the island 28 and the leads 30 are preferably exposed to the outside.

Figure 4B:
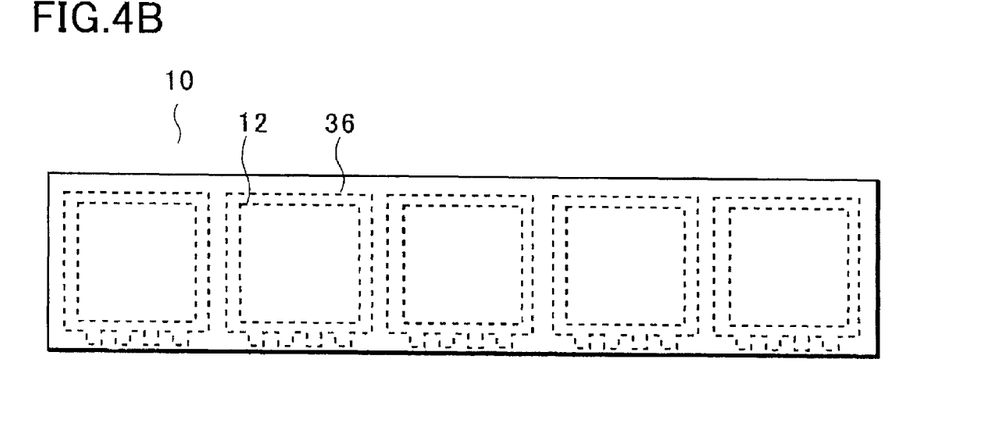
FIG. 4B is a plan view, for illustrating the method for manufacturing a circuit device according to the preferred embodiment.

FIG. 4B shows a plan view of the lead frame 10 after the above steps are completed. Here, the blocks 12 are individually sealed by the sealing resin 36.

Figure 5A:
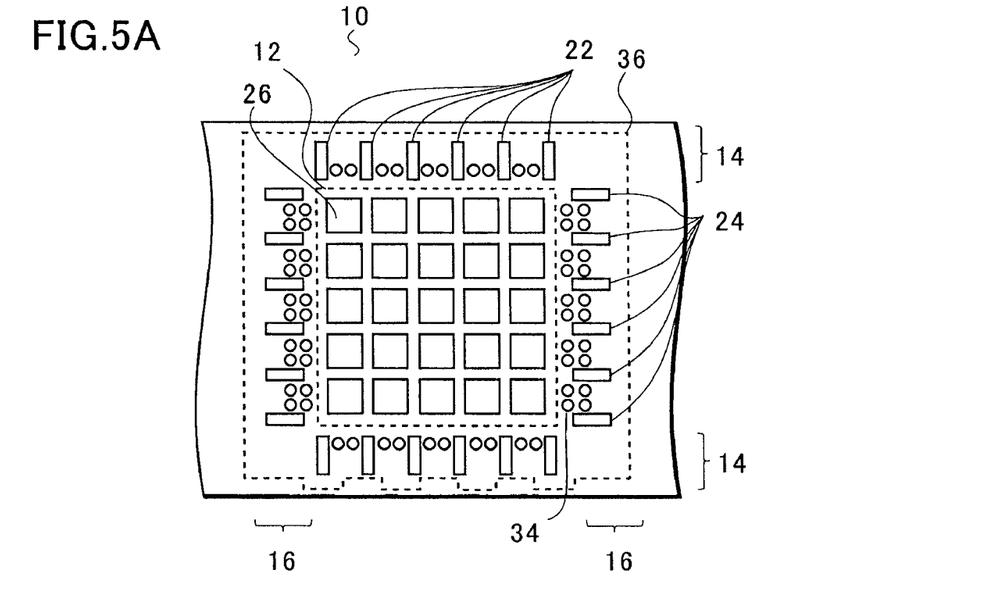
FIGS. 5A and 5B are plan views for illustrating the method for manufacturing a circuit device according to the preferred embodiment.
Figure 5B:
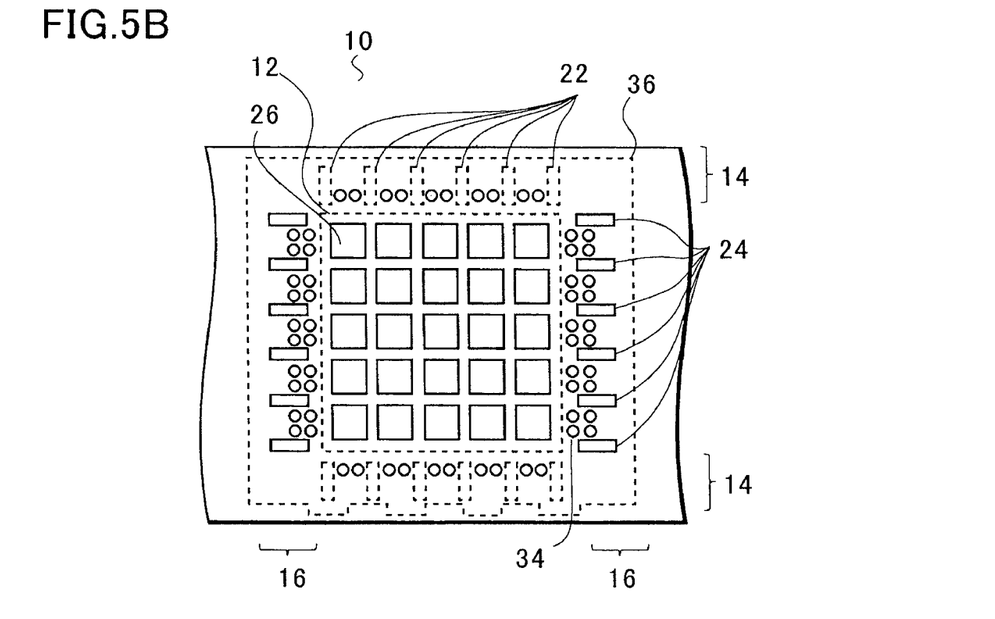

Description will be given of the details of the condition of each block 12 after the above-described resin-sealing step is completed with reference to FIGS. 5A and 5B. FIG. 5A is a plan view of the lead frame 10 as seen in a direction in which the sealing resin 36 is attached thereto. FIG. 5B is a plan view of the lead frame 10 as seen in the opposite direction.

As shown in FIG. 5A, the sealing resin 36 is formed to cover not only regions where the blocks 12 are formed but also the top surfaces of the first supporters 14 and the second supporters 16 in the peripheral portions of the blocks 12. In this manner, half grooves 22 and penetration grooves 24, which are provided respectively in the first supporters 14 and the second supporters 16 of the lead frame 10, are filled with the sealing resin 36. Furthermore, penetration holes 34 penetrating the first supporters 14 and the second supporters 16 are filled with the sealing resin 36.

As shown in FIG. 5B, the sealing resin 36 formed on the upper surface of the lead frame 10 is partially exposed from the back surface of the lead frame 10. Specifically, the sealing resin 36 filled in the penetration grooves 24 and the penetration holes 34 is exposed from the lower surface of the lead frame 10. On the other hand, since the half grooves 22 do not penetrate the lead frame 10, the sealing resin 36 filled in the half grooves 22 is not exposed from the lower surface of the lead frame 10.

Figure 6:
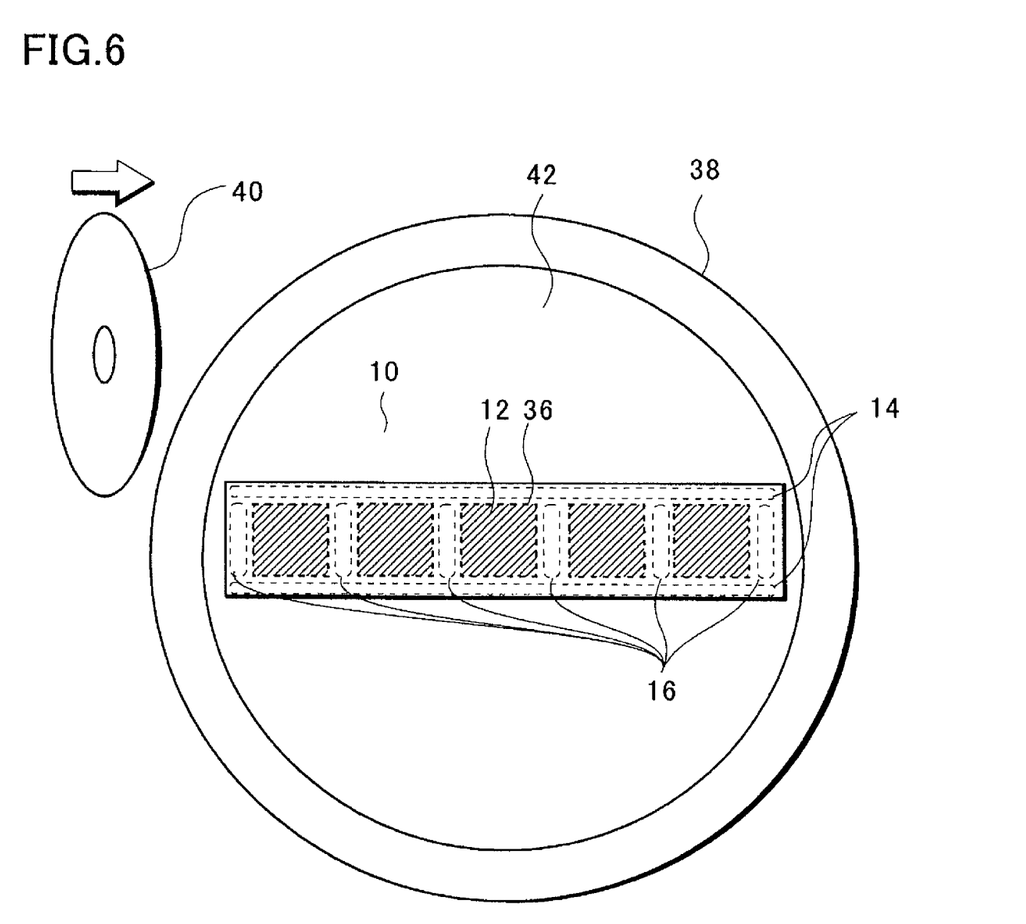
FIG. 6 is a plan view for illustrating the method for manufacturing a circuit device according to the preferred embodiment.
Figure 7A:
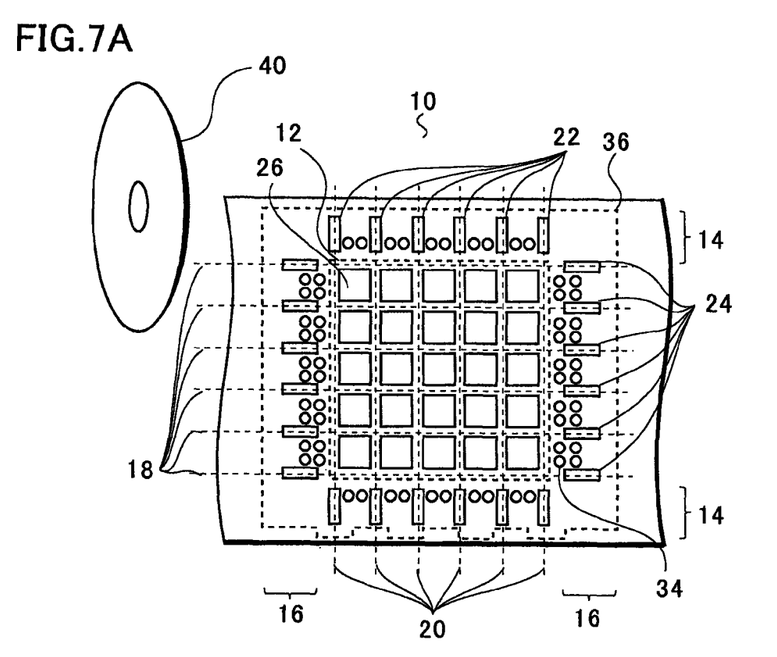
Figure 7B:
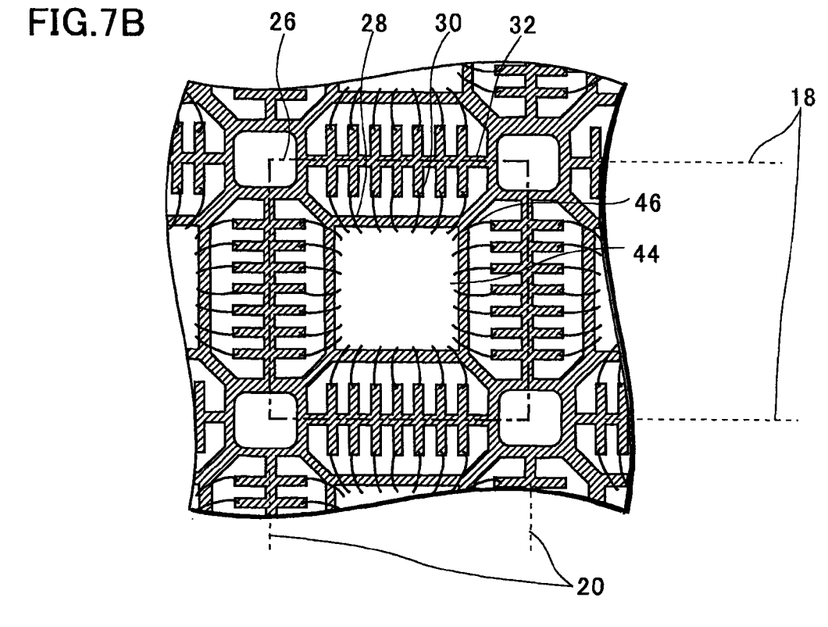
FIG. 7B is an enlarged plan view, for illustrating the method for manufacturing a circuit device according to the preferred embodiment.

Subsequently, as shown in FIGS. 6 to 7B, the units in each block 12 are individually separated. FIG. 6 is a view for illustrating a dicing step. FIGS. 7A and 7B are views illustrating a state where the blocks 12 are individually separated.

In this step, firstly, the lead frame 10 having been subjected to the resin sealing is pasted on a dicing sheet 42 as shown in FIG. 6. The dicing sheet 42 is a resin sheet having an adhesive layer formed on the upper surface, and is supported by a metal frame 38 at the periphery. The metal frame 38 is an annularly-formed metal such as stainless steel.

The lead frame 10 is pasted on the upper surface of the dicing sheet 42 with the above-described configuration. Here, although the lower surface of the lead frame 10 has been pasted with the adhesive sheet 48 in the previous step (see FIG. 3B), this adhesive sheet 48 may be removed in advance, or may be pasted on the dicing sheet 42 together with the lead frame 10 without being removed. Furthermore, the surface of the lead frame 10 to be pasted on the dicing sheet 42 may be the surface where the sealing resin 36 is formed, or may be the opposite surface to the surface where the sealing resin 36 is formed.

The dicing in this step is performed down to a depth where the sealing resin 36 of each block 12 is completely separated from the lead frame 10.

After the lead frame 10 is pasted on the dicing sheet 42, each block 12 formed in the lead frame 10 is diced at once using a dicing blade 40 that rotates at a high speed. In this step, the sealing resin 36 on each block 12 is diced, and also a metal outer frame (supporters) of the lead frame 10 is divided by dicing.

More specifically, the dicing performed in a lateral direction of the drawing separates all the blocks 12 formed in the lead frame 10 from each other in the lateral direction, and also divides the second supporters 16, which are the supporters extending in a short side direction of the lead frame 10. Furthermore, the dicing performed in a vertical direction of the drawing divides each block 12 in the vertical direction, and also divides the first supporters 14, which are the supporters extending in a longitudinal direction of the lead frame 10.

The details of the aforementioned dicing will be described with reference to FIGS. 7A and 7B. Firstly, the multiple units 26 are arranged in a matrix pattern in the single block 12 that is sealed as a single unit by the sealing resin 36. Dividing lines are defined in a lattice pattern and each defined between the two adjacent units 26. Here, dividing lines 18 are defined in the lateral direction of the drawing, while dividing lines 20 are defined in the vertical direction.

Furthermore, the penetration grooves 24 penetrating the second supporters 16 of the lead frame 10 are formed along the dividing lines 18. At the portions where the penetration grooves 24 are formed, a metal material constituting the lead frame 10 is removed, and only the sealing resin 36 exists. The metal material such as copper constituting the lead frame 10 is, here, a material harder to cut off than the sealing resin 36 constituted of an epoxy resin or the like. Thus, by providing the penetration grooves 24, the amount of the metal material cut off by the dicing blade 40 is reduced when the dicing is performed along the dividing lines 18. Thereby, the degree by which the dicing blade 40 wears due to the dicing is reduced.

Meanwhile, the half grooves 22 are formed along the dividing lines 20 that are defined in the vertical direction of the drawing. The half grooves 22 are formed by making the first supporters 14 of the lead frame 10 partially thin. Accordingly, the portions where the half grooves 22 are formed are in such a condition that the dicing with the dicing blade 40 can be performed more readily than the other regions of the first supporters 14. Thus, the provision of the half grooves 22 at the portions where the dividing lines 20 are defined reduces the degree by which the dicing blade 40 wears to separate the sealing resin 36 and the first supporters 14 along the dividing lines 20.

Furthermore, as shown in FIG. 7B, by performing the above-described dicing along the dividing lines 18 and 20, tie bars 32 each locating between the two adjacent units 26 are removed. Thus, as the tie bars 32 are removed in this step, the units 26 are electrically separated from each other. Moreover, the leads 30 and the island 28 locating inside each unit 26 are electrically separated from those in the other units 26.

As has been described, in this step, the penetration grooves 24 and the half grooves 22 are provided in order to reduce the amount of the metal material that is cut off by the dicing blade 40. Moreover, the tie bars 32 each locating between the two adjacent units 26 are removed by dicing with the dicing blade 40. For this reason, the widths of the penetration groove 24 and the half groove 22 are preferably wider than the width of the dicing blade 40. Furthermore, the width of the tie bar 32 is formed narrower than the width of the dicing blade 40.

After the above-described steps, a circuit device in which a semiconductor element is resin-packaged is manufactured.

Figure 8A:
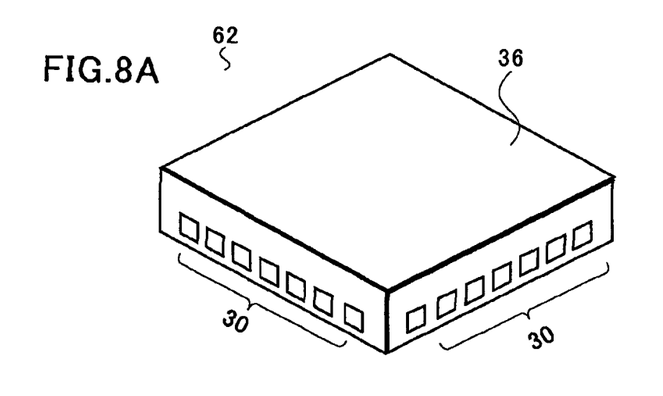
Figure 8B:
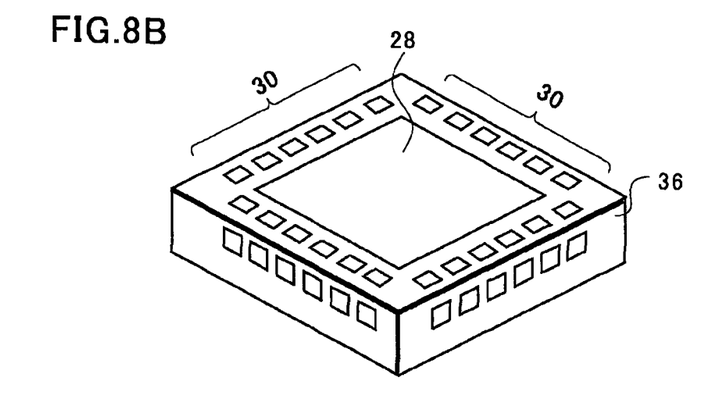

Next, the configuration of a circuit device 62 manufactured in accordance with the above-described process will be described with reference to FIGS. 8A to 8C. FIG. 8A is a perspective view of the circuit device 62 to be mounted, seen from the above. FIG. 8B is a perspective view of the circuit device 62 in the same state, seen from the below.

The external appearance of the circuit device 62 is a thin hexahedron as shown in FIG. 8A. As one example of the specific size of the circuit device 5, the length, breadth and thickness are approximately 5 mm, 5 mm and 0.4 mm, respectively. Most of the outer surface of the circuit device 62 is formed of a sealing resin 36. End portions of leads 30 are exposed from the side surfaces of the sealing resin 36. Each side surface of the sealing resin 36 and the exposed surfaces of the leads 30 are positioned on the same plane.

As shown in FIG. 8B, an island 28 is exposed on a central portion of the upper surface (mounting surface) of the circuit device 62, and the multiple leads 30 are exposed at positions surrounding the island 28 from the four sides. As has been described in the description of the manufacturing method, the island 28 is a portion where a semiconductor element is mounted. The leads 30 are electrically connected to electrodes of the semiconductor element through thin metal wires.

Figure 8C:
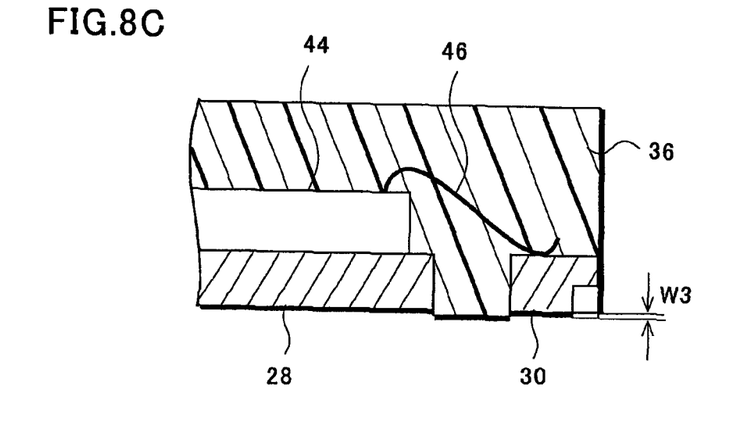
FIG. 8C is a cross-sectional view, for illustrating the method for manufacturing a circuit device according to the preferred embodiment.

As shown in FIG. 8C, the lower surfaces of the island 28 and the lead 30 are exposed while being recessed inwardly (upwardly) from the lower surface of the sealing resin 36. An inwardly recessed distance W3 of each of the lower surfaces of the island 28 and the lead 30 from the lower surface of the sealing resin 36 is for example approximately 1 μm to 2 μm.

When the circuit device 62 with the above-described configuration is mounted on a mounting board or the like, a brazing filler material such as solder is welded to the leads 30 exposed from the mounting surface (the upper surface shown in FIG. 8B) of the circuit device 62.

In this embodiment, the lead frame 10 itself is pasted on a dicing sheet 42, and the above-described dicing step is performed as shown in FIG. 6. Thereby, plural blocks 12 included in the single lead frame can be separated into units efficiently at once. As has been described, as in the conventional art where plural blocks 12 constituted of multiple units are formed in a lead frame 10, the blocks 12 separated from the lead frame 10 are pasted on a dicing sheet 42. In this case, however, the step of separating the blocks 12 from the lead frame 10 and the step of individually pasting each of the separated blocks 12 on the dicing sheet 42 increase the manufacturing cost. In this embodiment, in order to reduce the number of manufacturing steps and the manufacturing cost, the lead frame 10 itself is pasted on the dicing sheet 42 without separating the blocks 12 from the lead frame. Then, the lead frame 10 and the sealing resin 36 on each block 12 are cut off at once. This eliminates the needs of separating the blocks 12 from the lead frame 10 and of pasting each block 12 on the dicing sheet 42. Thus, the step of dividing the blocks 12 into individual circuit devices is simplified, and the manufacturing cost is reduced.

Furthermore, in this embodiment, half grooves 22 or penetration grooves 24 are provided in the portions corresponding to dividing lines as shown in FIG. 7A in order to efficiently perform dicing on the lead frame 10. As described above, the half grooves 22 and the penetration grooves 24 are provided along the dividing lines 18, 20 to perform the dicing. Thus, by providing the half grooves 22 and the penetration grooves 24, the region of the lead frame 10 which is cut by a dicing blade 40 is reduced. Thereby, the degree of wearing of the dicing blade 40 due to the dicing of the lead frame 10 is reduced.

Still furthermore, round penetration holes 34 penetrating portions of first supporters 14 and second supporters 16 of the lead frame 10 are formed as shown in FIG. 7A. Moreover, the sealing resin 36 is filled in the penetration holes 34. Thereby, the adhesion strength between each supporter and the sealing resin 36 is improved. Thus, even when the sealing resin 36 covering the first supporters 14 and the second supporters 16 is diced, the peeling-off of the separated sealing resin 36 from the lead frame 10 is prevented. This is because the sealing resin 36 is firmly adhered to the penetration holes 34 formed in both the supporters. If the separated sealing resin 36 is peeled off from the lead frame 10, the peeled sealing resin 36 may come into contact with the dicing blade 40, damaging the dicing blade 40 in some cases. This problem is avoided in this embodiment because of the penetration holes 34 formed in the lead frame 10, and the sealing resin 36 filled in the penetration holes 34.

According to the preferred embodiments of the present invention, the penetration grooves or the half grooves are provided in the outer frame of the lead frame corresponding to portions at the boundaries between the two units that are formed inside the lead frame. Accordingly, even when the outer frame of the lead frame is divided concurrently in the step of individually separating the units by dicing, the outer frame is separated easily at the portions where the penetration grooves or the half grooves are formed. Thereby, it is no longer necessary to separate resin packages from the lead frame and then individually paste the resin packages on a dicing sheet prior to dicing the resin packages as described in the conventional art. In this manner, the manufacturing process is simplified, and the manufacturing cost is reduced.

What is claimed is:

1. A method for manufacturing a circuit device, comprising:
   providing a lead frame elongated in a first direction and comprising a plurality of blocks aligned in the first direction, a first supporter disposed adjacent aligned edges of the blocks so as to extend in the first direction and a second supporter disposed between the blocks so as to extend in a second direction perpendicular to the first direction, the first and second supporters mechanically supporting the blocks, each of the blocks comprising a plurality of rectangular units arranged in a matrix form, the units each comprising an island and a plurality of leads provided adjacent the island, a penetration groove or a half groove being provided in the first supporter and the second supporter at a portion along a dividing line between the units, neither the penetration groove nor the half groove extending into the blocks in a top view of the lead frame, the penetration groove penetrating through the second supporter so as to be elongated in the first direction, and the half groove being formed by making the first supporter partially thin so as to be elongated in the second direction;
   fixing a circuit element to the island of each of the units;
   electrically connecting the circuit elements to the leads of corresponding units;
   covering the circuit element, the leads and corresponding portions of the first and second supporters with a sealing resin in each of the units;
   cutting the sealing resin along the dividing line; and
   cutting the supporter of the lead frame so as to cut through the penetration groove or the half groove so that the units are separated from each other,
   wherein, in the top view of the lead frame, the elongated half grooves are provided only in the first supporter, and the elongated penetration grooves are provided only in the second supporter.

2. The method of claim 1, wherein the first and second supporters of the lead frame together with the units is cut by dicing while the lead frame is pasted on a dicing sheet.

3. The method of claim 1, wherein the covering of the units comprises covering the penetration grooves and the half grooves.

4. The method of claim 1, wherein the first and second supporters have penetration holes, wherein during the covering of the units comprises covering the penetration holes are covered.

* * * * *